(12) United States Patent
Choung (10) Patent No.: US 8,847,661 B2
(45) Date of Patent: Sep. 30, 2014

(54) LEVEL SHIFT DEVICE

(71) Applicant: LSIS Co., Ltd., Anyang-si (KR)

(72) Inventor: Jae Seok Choung, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/015,927

(22) Filed: Aug. 30, 2013

(65) Prior Publication Data

US 2014/0062573 A1    Mar. 6, 2014

(30) Foreign Application Priority Data

Sep. 5, 2012 (KR) .................. 10-2012-0098498

(51) Int. Cl.
*H03L 5/00* (2006.01)
*H03K 3/01* (2006.01)
*H03K 3/356* (2006.01)

(52) U.S. Cl.
CPC ............ *H03K 3/01* (2013.01); *H03K 3/356113* (2013.01)
USPC ................................ 327/333; 326/62; 326/81

(58) Field of Classification Search
USPC .................. 326/62–63, 80–82; 327/306, 333
See application file for complete search history.

(56) References Cited

U.S. PATENT DOCUMENTS

| 5,852,366 | A | 12/1998 | Takahashi | |
|---|---|---|---|---|
| 7,808,294 | B1 * | 10/2010 | Kottapalli | 327/333 |
| 8,207,775 | B2 * | 6/2012 | Chern et al. | 327/333 |
| 2006/0006920 | A1 * | 1/2006 | Lee | 327/333 |
| 2011/0298777 | A1 | 12/2011 | Tsuchi | |

FOREIGN PATENT DOCUMENTS

| JP | 05-308274 | 11/1993 |
|---|---|---|
| JP | 07-193488 | 7/1995 |
| JP | 10-294662 | 11/1998 |
| JP | 11-136120 | 5/1999 |
| JP | 11-205123 | 7/1999 |
| JP | 11-261401 | 9/1999 |
| JP | 2001-177388 | 6/2001 |
| JP | 2012-070333 | 4/2012 |
| KR | 1020040061267 | 7/2004 |
| KR | 1020050076243 | 7/2005 |
| KR | 100774893 | 11/2007 |
| KR | 100774893 B1 * | 11/2007 |

OTHER PUBLICATIONS

Korean Intellectual Property Office Application Serial No. 10-2012-0098498, Office Action dated Aug. 16, 2013, 4 pages.
Korean Intellectual Property Office Application Serial No. 10-2012-0098498, Notice of Allowance dated Mar. 31, 2014, 2 pages.
Japan Patent Office Application Serial No. 2013-183941, Office Action dated Jul. 28, 2014, 3 pages.

* cited by examiner

*Primary Examiner* — Dinh Le (74) *Attorney, Agent, or Firm* — Lee, Hong, Degerman, Kang & Waimey (57) ABSTRACT

Disclosed is a level shift device. The level shift device to convert an input signal having a low-voltage level into an output signal having a high-voltage level includes a latch-type level shifter and a voltage generator. The latch-type level shifter includes two upper pull-up P channel transistors and two lower P channel transistors to prevent the gate-source voltage breakdown of the two upper pull-up P channel transistors. The two upper pull-up P channel transistors and the two lower P channel transistors form a latch structure. The voltage generator generates a voltage to prevent the gate-source voltage brake down of the two upper pull-up P channel transistors and provides the voltage to the gate electrodes of the two lower P channel transistors.

10 Claims, 8 Drawing Sheets

FIG.8

LEVEL SHIFT DEVICE

Pursuant to 35 U.S.C. §119(a), this application claims the benefit of earlier date and right of priority to Korean Patent Application No. 10-2012-0098498, filed on Sep. 5, 2012, the contents of which is incorporated by reference herein in its entirety.

BACKGROUND OF THE INVENTION

The embodiment relates to a level shifter to convert a low-voltage level input signal into a high-voltage level output signal and a gate driving device of an insulated gate bipolar transistor (IGBT) including the level shifter.

In general, in an insulated gated bipolar transistor (IGBT), if gate voltage is not sufficiently great voltage of 13V or less, the saturation voltage VCE_SAT of a device is increased. If the gate voltage is significantly low voltage of 10V or less, the IGBT operates at an active region, so that the device may be overheated and damaged. Accordingly, in order to prevent the device from being overheated and damaged, a gate driving circuit to drive the IGBT includes a level shifter unit to convert a low-voltage level input signal (in the range of 3.3 V to 5.5 V) into a high-voltage level output signal (in the range of 15 V to 20 V), so that the IGBT is driven at the gate voltage of 15 V or more.

In a latch-type level shift device generally used for a gate driving circuit according to the related art, power consumption is not only increased due to static current and rising propagation delay, but also a chip price is increased due to the increase of the chip size.

SUMMARY OF THE INVENTION

The embodiment provides a level shift device capable of reducing power consumption by preventing static current from being generated.

The embodiment provides a level shift device capable of reducing a chip size also.

The embodiment provides a level shift device capable of improving a switch speed by reducing propagation delay while preventing a Vgs breakdown phenomenon.

According to the embodiment, there is provided a level shift device to convert an input signal having a first voltage level into an output signal having a second voltage level. The level shift device includes a latch-type level shifter comprising two upper pull-up P channel transistors having a latch structure and two lower P channel transistors to prevent a gate-source voltage breakdown phenomenon of the two upper pull-up P channel transistors, and a voltage generator to generate a voltage to prevent the gate-source voltage breakdown phenomenon of the two upper pull-up P channel transistors and provide the voltage to gate electrodes of the two lower P channel transistors. The second voltage level is higher than the first voltage level.

According to the embodiment, there is provided a level shift device to convert an input signal having a first voltage level into an output signal having a second voltage level. The level shift device includes a first P channel transistor, a second P channel transistor comprising a gate electrode connected to a drain electrode of the first P channel transistor and a drain electrode connected to a gate electrode of the first P channel transistor, a third P channel transistor comprising a source electrode connected to the drain electrode of the first P channel transistor, a fourth P channel transistor comprising a source electrode connected to the drain electrode of the second P channel transistor and a gate electrode connected to a gate electrode of the third P channel transistor, and a first Zener diode having an anode electrode connected to the gate electrode of the third P channel transistor. The second voltage level is higher than the first voltage level.

As described above, according to the level shift device of one embodiment, a Vgs breakdown phenomenon of a pull-up MOS can be prevented, and static current flowing through a Zener diode for voltage control is removed, so that undesirable power consumption can be reduced.

In addition, according to the level shift device of the embodiment, the PMOS for reducing pull-up time used to receive the propagation delay of the level shift device is substituted with an NMOS, so that the size of a switching device for pull-up time and the size of a bootstrap capacitor can be reduced, so that the manufacturing cost resulting from the chip size can be reduced.

According to the level shift device of the embodiment, the Vgs breakdown phenomenon is prevented while the propagation delay is reduced, so that the switch speed can be improved.

DETAILED DESCRIPTION OF THE PREFERRED EMBODIMENT

Hereinafter, a level shift device according to embodiments will be described in more detail with reference to accompanying drawings. In the following description, suffixes "module" and "unit" are only added in order to facilitate the description of the specification, and may be compatibly used with each other.

In the following description, when a part is connected to the other part, the parts are not only directly connected to each other, but also electrically connected to each other while interposing another part therebetween.

Figure 1:
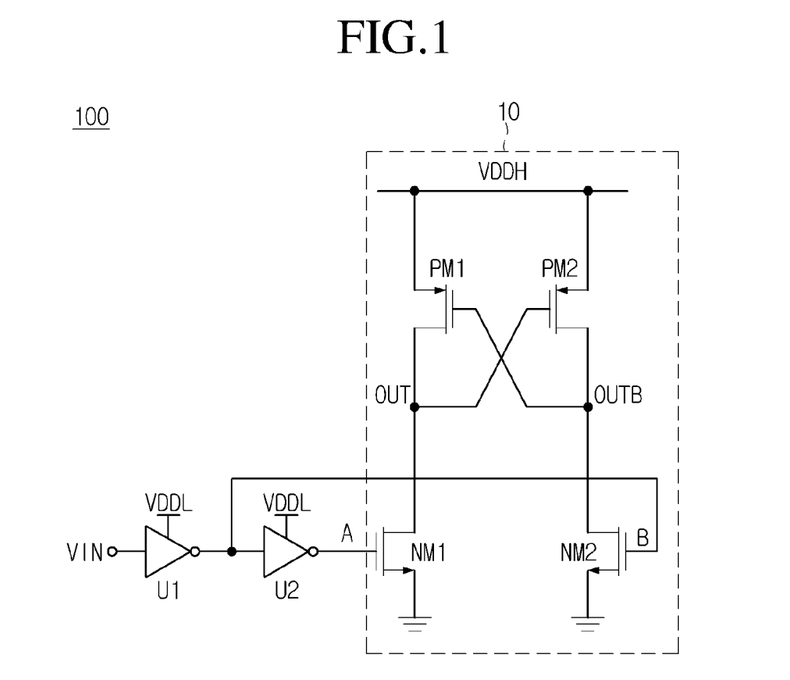
FIG. 1 is a circuit diagram showing a level shift device according to one embodiment.

FIG. 1 is a circuit diagram showing a level shift device according to one embodiment.

As shown in FIG. 1, a level shift device 100 according to one embodiment includes a NOT gate U1, a NOT gate U2, and a latch-type level shifter unit 10. The latch-type level shifter unit 10 includes a first NMOS NM1 and a second NMOS NM2 performing lower switch functions and a first PMOS PM1 and a second PMOS PM2 performing upper switch functions.

The level shift device 100 of FIG. 1 receives a low-voltage input signal from a controller (not shown) such as a CPU (central processing unit) to output a high-voltage switching signal sufficient to drive a gate of an IGBT.

The low-voltage input signal is applied to an input terminal of the NOT gate U1. Low driving voltage VDDL is applied to the NOT gate U1.

An input terminal of the NOT gate U2 is connected with an output terminal of the NOT gate U1. Low driving voltage VDDL is applied to the NOT gate U2.

The first NMOS NM1 includes a drain electrode connected to a drain electrode of the first PMOS PM1, a gate electrode connected to the output terminal of the NOT gate U2, and a source electrode connected to the ground.

The second NMOS NM2 includes a drain electrode connected to a drain electrode of the second PMOS PM2, a gate electrode connected to an output terminal of the NOT gate U1, and a source electrode connected to the ground.

The first PMOS PM1 includes a source electrode to which high driving voltage VDDH is applied, a gate electrode connected to the drain electrode of the second NMOS NM2, and a drain electrode connected to the first NMOS NM1.

The second PMOS PM2 includes a source electrode to which high driving voltage VDDH is applied, a gate electrode connected to the drain electrode of the first NMOS NM1, and a drain electrode connected to the drain electrode of the second NMOS NM2.

Hereinafter, the operation of the level shift device 100 of FIG. 1 will be described below.

The NOT gate U1 inverts the low-voltage input signal to generate a low-voltage inverted input signal. The NOT gate U2 re-inverts the low-voltage inverted input signal generated by the NOT gate U1 to generate a low-voltage re-inverted input signal.

If a High-state input signal VIN is input to the level shift device 100, the first NMOS NM1 placed at a lower side is turned on, and the second NMOS NM2 is turned off, so that the state of a node OUT is shifted from 'High' to 'Low' by the first NMOS NM1. Accordingly, the second PMOS PM2 placed at an upper side is turned on, so that the state of a node OUTB is shifted from 'Low' to 'High'. Accordingly, the first PMOS PM1 placed at the upper side is turned off. In this case, during the state transition of the nodes OUT and OUTB, short-circuit current is generated between the first NMOS NM1 and the first PMOS PM1.

On the contrary, if a Low-state input signal VIN is input to the level shift device 100, the second NMOS NM2 placed at the lower side is turned on, and the first NMOS NM1 is turned off, so that the state of the node OUTB is shifted from 'High' to 'Low' by the second NMOS NM2. Accordingly, the first PMOS PM1 placed at the upper side is turned on, so that the state of the node OUT is shifted from 'Low' to 'High'. Accordingly, the second PMOS PM2 placed at the upper is turned off. Similarly, during the state transition of the nodes OUT and OUTB, short-circuit current is generated between the second NMOS NM2 and the second PMOS PM2.

Hereinafter, a level shift device 200 according to another embodiment will be described with reference to FIGS. 2 to 4.

Figure 2:
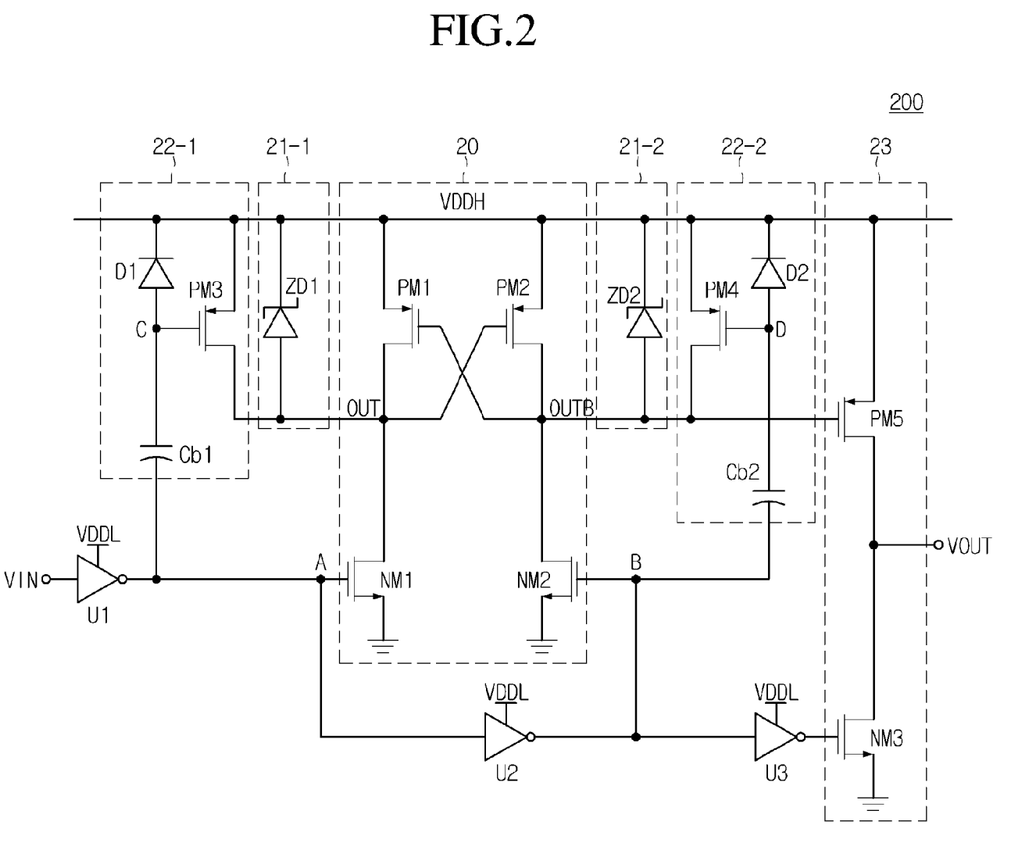
FIG. 2 is a circuit diagram a level shift device according to another embodiment.

FIG. 2 is a circuit diagram a level shift device according to another embodiment.

As shown in FIG. 2, the level shift device 200 according to another embodiment includes a level shifter unit 20 to convert a level of input voltage of a circuit into a level of high voltage, which is driving voltage, voltage control units 21-1 and 21-2 to restrict Vgs of a pull-up PMOS of the level shifter unit 20 to a predetermined voltage value, thereby preventing the Vgs breakdown phenomenon of the pull-up PMOS, and pull-up time reducing units 22-1 and 22-2 to reduce pull-up time when the pull-up PMOS of the level shifter unit 20 is pull up, and a voltage output unit 23 to receive the output voltage of the level shifter unit 20 and the input voltage of the circuit, and perform buffering for the output voltage to be output.

The level shift device 200 of FIG. 2 is acquired by overcoming a portion of disadvantages of the latch-type level shift circuit of FIG. 1 by adding the voltage control units 21-1 and 21-2, which restricts Vgs of the pull-up PMOS of the level shifter unit 20 to a predetermined voltage value so that the Vgs breakdown phenomenon of the pull-up PMOS is prevented, and the pull-up time reducing units 22-1 and 22-2, which reduces the pull-up time when the pull-up PMOS of the level shifter unit 20 is pull up, to the latch-type level shift circuit of FIG. 1.

Hereinafter, the operation of the level shift device 200 of FIG. 2 will be described with reference to FIGS. 3 and 4 below.

Figure 3:
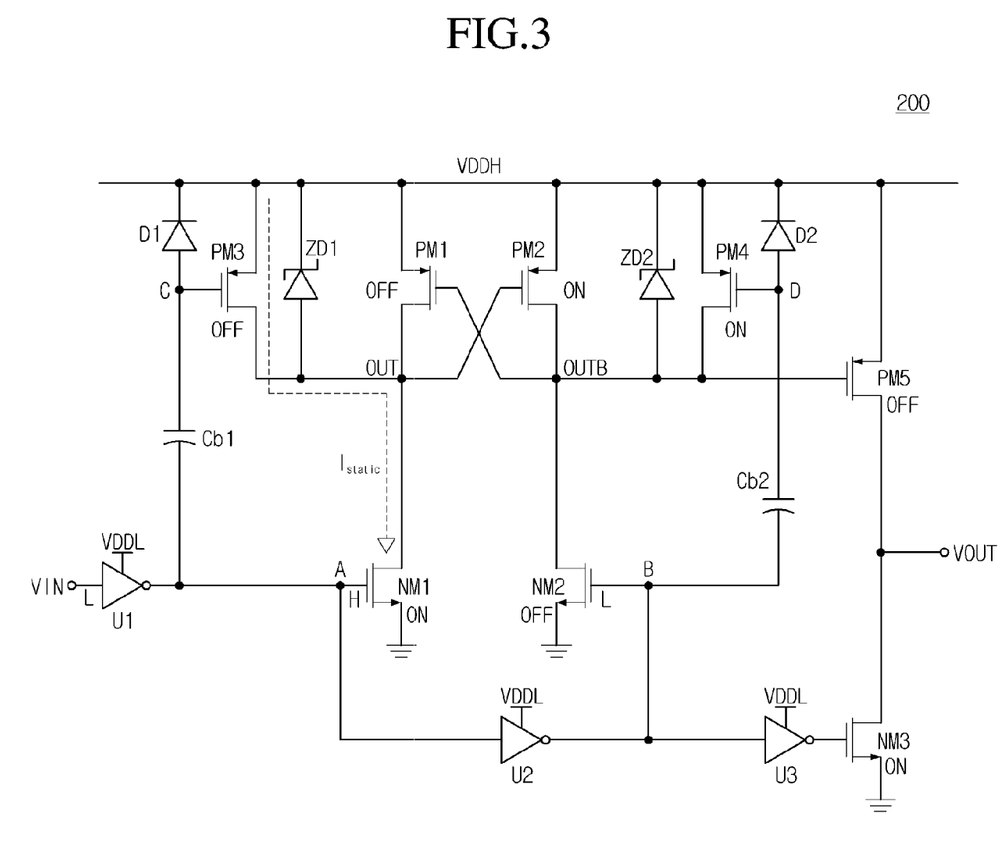
FIG. 3 is a circuit diagram showing the operation of the level shift device of FIG. 2 to receive the input signal having a low level.

FIG. 3 is a circuit diagram showing the operation of the level shift device of FIG. 2 to receive the input signal having a low level.

If a Low-state input signal VIN is input to the level shift device 200, the first NMOS NM1 placed at a lower side is turned on, and the second NMOS NM2 is turned off, so that the state of the node OUT is shifted from 'High' to 'Low' by the first NMOS NM1. Accordingly, the second PMOS PM2 placed at an upper side is turned on, so that the state of the node OUTB is shifted from 'Low' to 'High'. Accordingly, the first PMOS PM1 placed at the upper side is turned off. In this case, the pull-up time reducing unit 22-2 reduces time at which the voltage at the node OUTB is charged with VDDH, and the voltage control unit 21-1 restricts the voltage at the node OUT to a predetermined voltage VDDH-Vz. However, as static current flows through a first Zener diode ZD1 of the voltage control unit 21-1 and the first NMOS NM1 placed at the lower side, undesirable power consumption may be caused.

A fifth PMOS PM5 placed at the upper side of the voltage output unit 23 is turned off, and a third NMOS NM3 placed at the lower side of the voltage output unit 23 is turned on, so that a terminal VOUT outputs ground voltage GND.

Figure 4:
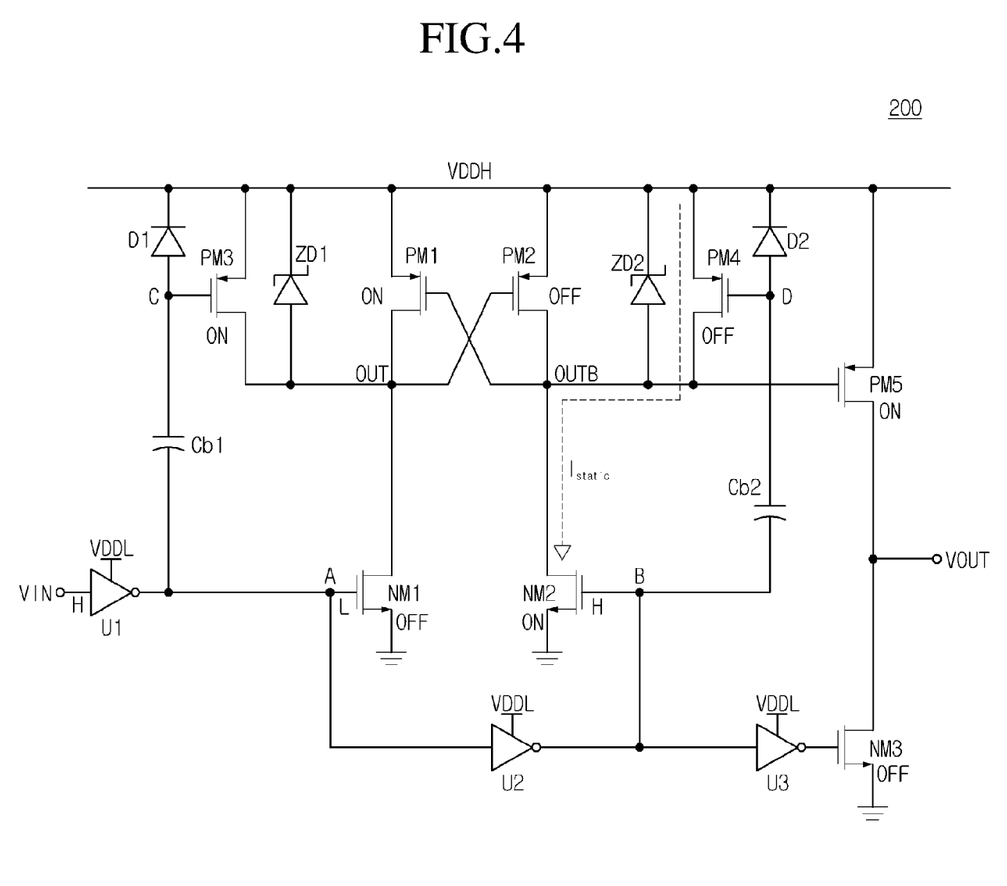
FIG. 4 is a circuit diagram showing the operation of the level shift device of FIG. 2 to receive the input signal having a high level.

FIG. 4 is a circuit diagram showing the operation of the level shift device 200 of FIG. 2 to receive the input signal having a high level.

If a High-state input signal VIN is input to the level shift device 200, the second NMOS NM2 placed at a lower side is turned on, and the first NMOS NM1 is turned off, so that the state of the node OUT is shifted from 'High' to 'Low' by the second NMOS NM2. Accordingly, the first PMOS PM1 placed at an upper side is turned on, so that the state of the node OUT is shifted from 'Low' to 'High'. Accordingly, the second PMOS PM2 placed at the upper side is turned off. In this case, the pull-up time reducing unit 22-1 reduces time at which the voltage at the node OUTB is charged with VDDH, and the voltage control unit 21-2 restricts the voltage at the node OUTB to a predetermined voltage VDDH-Vz. However, as static current flows through a second Zener diode ZD1 of the voltage control unit 21-2 and the second NMOS NM2 placed at the lower side, undesirable power consumption may be caused.

The fifth PMOS PM5 placed at the upper side of the voltage output unit 23 is turned on, and the third NMOS NM3 placed at the lower side of the voltage output unit 23 is turned off, so that the terminal VOUT outputs the voltage VDDH.

However, following problems still remain in the level shift device according to embodiments shown in FIGS. 1 to 4.

In other words, the latch-type level shift circuit of FIG. 1 generates short-circuit current during the state transition time of the node OUT or the node OUTB. Therefore, as the state transition time of the node OUT or the node OUTB is increased, power consumption is increased. However, when the transistor has a latch structure as described above, the state of the node OUTB (or the node OUT) is shifted from a 'Low' state to a 'High' state after the state of the opposite node OUT (or the node OUTB) is shifted from a 'High' state to a 'Low' state. Accordingly, the propagation delay required to shift the state of the node OUT or the node OUTB from 'Low' state to the 'High' state is greatly made. Accordingly, the switch speed of the level shifter may be reduced, and the power consumption may be increased. In addition, the Vgs breakdown voltage of the high-voltage transistor provided in the manufacturing company has various values depending on the manufacturing companies. However, the Vgs breakdown voltage is in the range of 12 V or less to 20 V or less. Accordingly, when the VDDH voltage is low voltage within several volts or less, problems may not occur. However, when the VDDH voltage is high voltage within several tens volts or less, the Vgs (gate-source voltage) breakdown phenomenon of the first and second PMOSs PM1 and PM2 is caused, so that the device may be broken.

The level shift device 200 of FIG. 2 makes the Vgs of the second PMOS PM2 and the first PMOS PM1 smaller than the Vgs breakdown voltage by restricting the voltage at the drain electrodes of the first NMOS NM1 and the second NMOS NM2 to a predetermined value using a Zener diode, thereby preventing the breakdown phenomenon. The level shift device 200 of FIG. 2 reduces the propagation delay using the first and second PMOSs PM1 and PM2 of the pull-up time reducing units 22-1 and 22-2 to reduce power consumption resulting from the short-circuit current as compared with the latch-type level shift of FIG. 1. However, when the voltage is restricted by using a Zener diode as shown in FIG. 2, even if the transition of the state of the node OUT or the node OUTB is completed as sown in FIGS. 3 and 4, that is, even if the switching operation is completed, static current continuously flows through the Zener diode, so that the undesirable power consumption occurs. Since the static current is increased proportionally to the supply voltage VDDH, as the supply voltage VDDH is increased, the power consumption is more increased. In addition, since the first and second PMOSs PM1 and PM2 used in the pull-up time reducing units 22-1 and 22-2 represent a great on-resistance, the first and second PMOSs PM1 and PM2 must have large sizes in order to drive large current capacity. Accordingly, the gate charge capacity is increased in order to drive the first and second PMOSs PM1 and PM2, so that the bootstrap capacitors Cb1 and Cb2 to drive the first and second PMOSs PM1 and PM2 are increased. Accordingly, the chip size is increased, and thus the cost in the chip manufacturing is increased.

For example, the level shift circuit of the gate driving circuit may include a latch-type level shift device as shown in FIG. 1. In the above structure, power consumption occurs due to the great propagation delay and the short-circuit current. In addition, when the supply voltage VDDH is small voltage within several volts, problems may not occur. However, when the supply voltage VDDH is high voltage within several tens volts, a Vgs breakdown phenomenon occurs in the first PMOS PM1, the second PMOS PM2, and the third PMOS PM3 placed at the upper side, so that the device may be broken. In order to solve the above problem, the drain voltage of the first and second NMOSs NM1 and NM2 is restricted to a predetermined value by using the Zener diode as shown in FIG. 2, thereby preventing the Vgs breakdown phenomenon of the second and first PMOSs PM2 and PM1. In addition, the propagation delay is reduced by using the first and second PMOSs PM1 and PM2 of the pull-up time reducing unit 22-1 and 22-2 to reduce the power consumption resulting from the short-circuit current. In this case, undesirable power consumption occurs due to the static current flowing through the Zener diode, and the chip size is increased due to the first and second PMOSs PM1 and PM2 of the pull-up time reducing units 22-1 and 22-2, so that the cost in the chip manufacturing is increased.

Hereinafter, a level shift device 300 according to still another embodiment will be described with reference to FIGS. 5 to 7.

Figure 5:
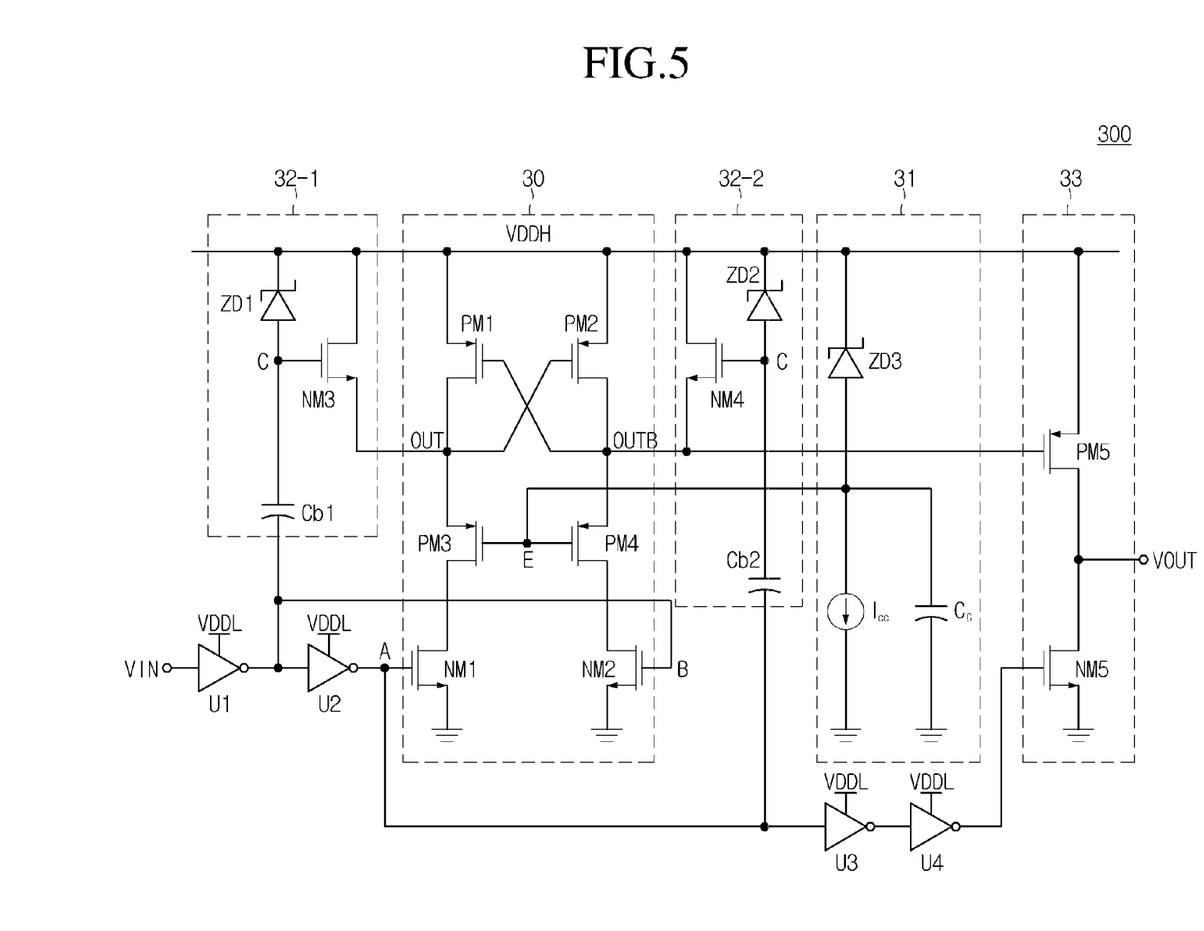
FIG. 5 is a circuit diagram showing a level shift device according to still another embodiment.

FIG. 5 is a circuit diagram showing a level shift device 300 according to still another embodiment.

As shown in FIG. 5, the level shift device 300 according to the embodiment includes a NOT gate U1, a NOT gate U2, a NOT gate U3, a NOT gate U4, a latch-type level shifter unit 30, a voltage generator 31, a pull-up time reducing unit 32-1, a pull-up time reducing unit 32-2, and a voltage output unit 33.

The 1a latch-type level shifter unit 30 converts the level of the input signal of the level shift device 300 into the level of high voltage which is driving voltage.

The voltage generator 31 restricts Vgs of a pull-up PMOS of the latch-type level shifter unit 30 to a predetermined voltage value to prevent the Vgs breakdown phenomenon of the pull-up PMOS.

When the pull-up PMOS PM1 of the latch-type level shifter unit 30 is pulled up, the pull-up time reducing unit 32-1 reduces the pull-up time. When the pull-up PMOS PM2 of the latch-type level shifter unit 30 is pulled up, the pull-up time reducing unit 32-2 reduces the pull-up time.

The voltage output unit 33 receives the output voltage of the latch-type level shifter unit 30 and the input signal of the level shift device 300 and performs buffering the output voltage and the input signal to be output.

The latch-type level shifter unit 30 includes a first PMOS PM1, a second PMOS PM2, a first NMOS NM1, a second NMOS NM2, a third PMOS PM3, and a fourth PMOS PM4. The first PMOS PM1 and the second PMOS PM2 placed at the upper side of the latch-type shifter unit 30 construct a latch structure together with the first NMOS NM1 and the second NMOS NM2 placed at the lower side of the latch-type shifter unit 30. The third and fourth PMOSs PM3 and PM4 are transistors to prevent Vgs breakdown phenomenon of the first and second PMOSs PM1 and PM2 which are pull-up PMOSs.

The voltage generator 31 includes a Zener diode ZD3, a constant current source ICC, and a capacitor Cc.

The pull-up time reducing unit 32-1 includes a Zener diode ZD1, a third NMOS NM3, and a bootstrap capacitor Cb1.

The pull-up time reducing unit 32-2 includes a Zener diode ZD2, a fourth NMOS NM4, and a bootstrap capacitor Cb2.

The voltage output unit 33 includes a fifth PMOS PM5 placed at the upper side thereof and a fifth NMOS NM5 placed at the lower side thereof.

The NOT gate U1 has input and output terminals. The low-voltage level input signal is applied to the input terminal of the NOT gate U1.

The NOT gate U2 has input and output terminals. The input terminal of the NOT gate U2 is connected to the output terminal of the NOT gate U1.

The NOT gate U3 has input and output terminals. The input terminal of the NOT gate U3 is connected to the output terminal of the NOT gate U2.

The NOT gate U4 has input and output terminals. The input terminal of the NOT gate U4 is connected to the output terminal of the NOT gate U3.

The first PMOS PM1 has a source electrode, a gate electrode, and a drain electrode. High-voltage level driving voltage VDDH is applied to the source electrode of the first PMOS PM1.

The second PMOS PM2 has a source electrode, a gate electrode, and a drain electrode. High-voltage level driving voltage VDDH is applied to the source electrode of the second PMOS PM2. The gate electrode of the second PMOS PM2 is connected to the drain electrode of the first PMOS PM1. The drain electrode of the second PMOS PM2 is connected to the gate electrode of the first PMOS PM1.

The third PMOS PM3 has a source electrode, a gate electrode, and a drain electrode. The source electrode of the third PMOS PM3 is connected to the drain electrode of the first PMOS PM1.

The fourth PMOS PM4 has a source electrode, a gate electrode, and a drain electrode. The source electrode of the fourth PMOS PM4 is connected to the drain electrode of the second PMOS PM2. The gate electrode of the fourth PMOS PM4 is connected to the gate electrode of the third PMOS PM3.

The first NMOS NM1 has a drain electrode, a gate electrode, and a source electrode. The drain electrode of the first NMOS NM1 is connected to the drain electrode of the third PMOS PM3. The gate electrode of the first NMOS NM1 is connected to the output terminal of the NOT gate U2. The source electrode of the first NMOS NM1 is connected to the ground.

The second NMOS NM2 has a drain electrode, a gate electrode, and a source electrode. The drain electrode of the second NMOS NM2 is connected to the drain electrode of the fourth PMOS PM4. The gate electrode of the second NMOS NM2 is connected to the output terminal of the NOT gate U1. The source electrode of the second NMOS NM2 is connected to the ground.

The third NMOS NM3 has a drain electrode, a gate electrode, and a source electrode. High-voltage level driving voltage VDDH is applied to the drain electrode of the third NMOS NM3. The source electrode of the third NMOS NM3 is connected to the drain electrode of the first PMOS PM1.

The Zener diode ZD1 has an anode electrode and a cathode electrode. The high-voltage level driving voltage VDDH is applied to the cathode electrode of the Zener diode ZD1. The anode electrode of the Zener diode ZD1 is connected to the gate electrode of the third NMOS NM3.

The bootstrap capacitor Cb1 has one end connected to the anode electrode of the Zener diode ZD1 and an opposite end connected to the gate electrode of the third NMOS NM3.

The fourth NMOS NM4 has a drain electrode, a gate electrode, and a source electrode. The high-voltage level driving voltage VDDH is applied to the drain electrode of the fourth NMOS NM4. The source electrode of the fourth NMOS NM4 is connected to the drain electrode of the second PMOS PM2.

The Zener diode ZD2 has an anode electrode and a cathode electrode. The high-voltage level driving voltage VDDH is applied to the cathode electrode of the Zener diode ZD2. The anode electrode of the Zener diode ZD2 is connected to the gate electrode of the fourth NMOS NM4.

The bootstrap capacitor Cb2 has one end connected to the anode electrode of the Zener diode ZD and an opposite end connected to the gate electrode of the fourth NMOS NM4.

The fifth PMOS PM5 has a source electrode, a gate electrode, and a drain electrode. The high-voltage level driving voltage VDDH is applied to the source electrode of the fifth PMOS PM5. The gate electrode of the fifth PMOS PM5 is connected to the drain electrode of the second PMOS PM2. The drain electrode of the fifth PMOS PM5 outputs the high-voltage level output signal that has been buffered.

The fifth NMOS NM5 has a drain electrode, a gate electrode, and a source electrode. The drain electrode of the fifth NMOS NM5 is connected to the drain electrode of the fifth PMOS PM5. The gate electrode of the fifth NMOS NM5 is connected to the output terminal of the NOT gate U4. The source electrode of the fifth NMOS NM5 is connected to the ground.

The Zener diode ZD3 has an anode electrode and a cathode electrode. The high-voltage level driving voltage VDDH is applied to the cathode electrode of the Zener diode ZD3.

The constant current source Icc has a current input terminal connected to the anode electrode of the Zener diode ZD3 and a current output terminal connected to the ground.

The capacitor Cc has one terminal connected to the anode electrode of the Zener diode ZD3 and an opposite end connected to the ground.

The bias voltage VDDH-Vz generated from the voltage generator 31 is applied to the gate electrodes of the third and fourth PMOSs PM3 and PM4.

The bias voltage VDDH-Vz is applied to the gate electrodes of the third and fourth PMOSs PM3 and PM4 of the latch-type level shifter unit 30.

Hereinafter, the operation of the level shift device 300 of FIG. 5 will be described with reference to FIGS. 6 and 7.

Figure 6:
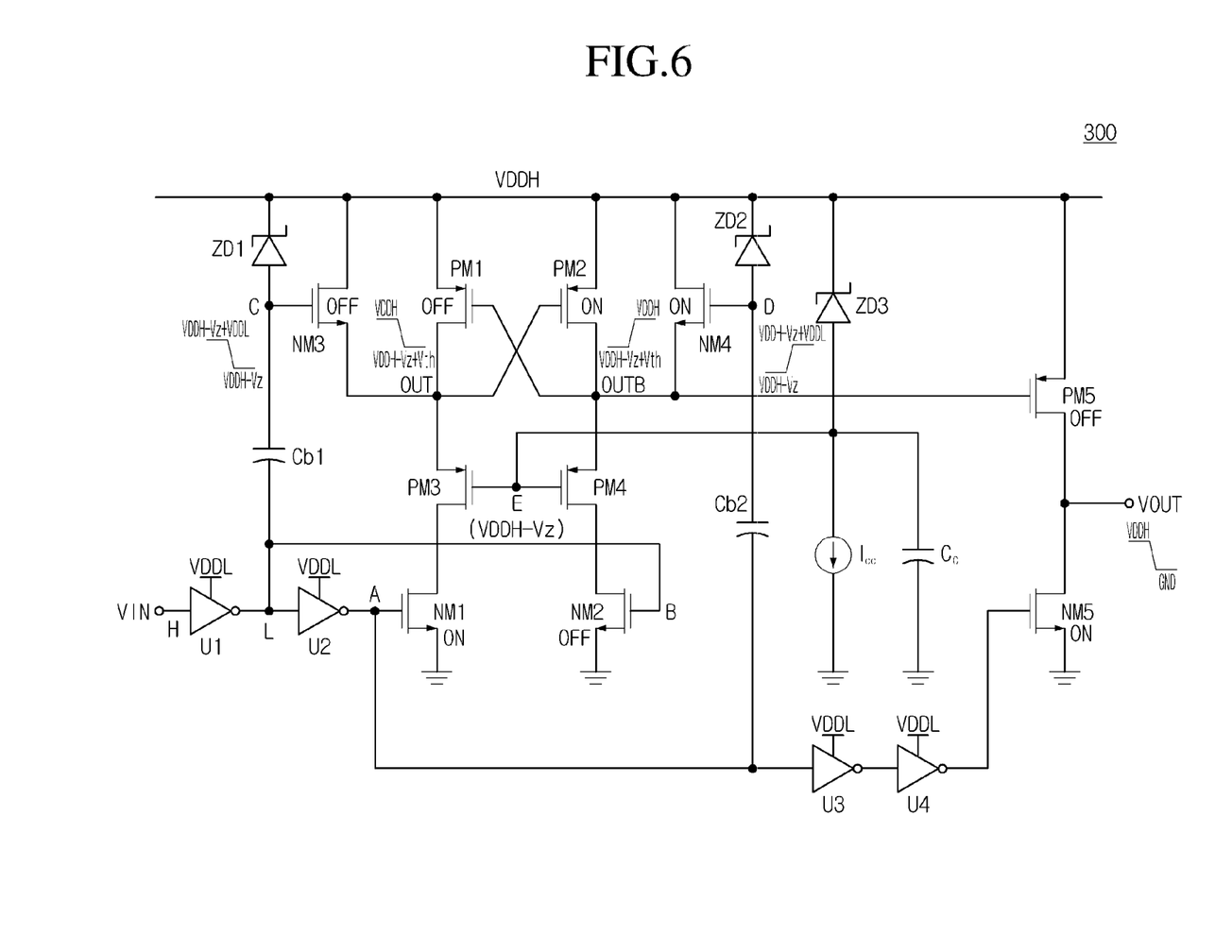
FIG. 6 is a circuit diagram showing the operation of the level shift device of FIG. 5 to receive the input signal having a high level.

FIG. 6 is a circuit diagram showing the operation of the level shift device to receive the high-level input signal.

If a high-level input signal VIN is input, the first NMOS NM1 provided at the lower portion of the level shift device 300 is turned on, and the second NMOS NM2 is turned off, so that the state of the node OUT is shifted from a 'High' state to a 'Low' state by the first NMOS NM1. Accordingly, the second PMOS PM2 placed at the upper side of the level shift device 300 is turned on to shift the state of the node OUTB from a 'Low' state to a 'High' state, so that the first PMOS PM1 placed at the upper side of the level shift device 300 is turned off. In this case, the voltage at the node C is reduced from the voltage VDD-Vz+VDDL to the voltage VDD-Vz by the first bootstrap capacitor Cb1, the third NMOS NM3 of the pull-up time reducing time 32-1 is turned off, and the voltage at the node D is increased from voltage VDD-Vz to voltage VDD-Vz+VDDL by the second bootstrap capacitor Cb2, so that the fourth NMOS NM4 of the pull-up time reducing unit 32-2 is turned on. Accordingly, the time at which the voltage at the node OUTB is charged with VDDH is reduced. In this case, if the voltage at the node E is constantly maintained to the bias voltage VDDH-Vz supplied by the voltage generator 31, so that the voltage at the node OUT is reduced to predetermined voltage VDDH-Vz+Vth or less, the third PMOS PM3 is turned off, so that the voltage at the node OUT is increased again. If the voltage at the node OUT is increased to the predetermined voltage VDDH-Vz+Vth or more, the third PMOS PM3 is turned on, and the feedback operation to reduce the drain voltage of the first PMOS PM1 again is performed, so that the voltage at the node OUT is restricted to the predetermined voltage VDDH-Vz+Vth. Accordingly, even if the supply voltage VDDH is increased, the Vgs of the first and second PMOSs PM1 and PM2, which serve as pull-up PMOSs of the latch-type level shifter unit 30, is maintained to the predetermined voltage Vz-Vth to prevent the Vgs breakdown phenomenon of the pull-up PMOS resulting to the increase of the supply voltage VDDH. In addition, different from the related art, since the Zener diode is not used, so that the undesirable static current is not generated.

The fifth PMOS PM5 placed at the upper side of the voltage output unit 33 is turned off by the latch-type level shifter unit 30, and the fifth NMOS NM5 placed at the lower side of the voltage output unit 33 is turned on, so that the terminal VOUT outputs voltage GND.

Figure 7:
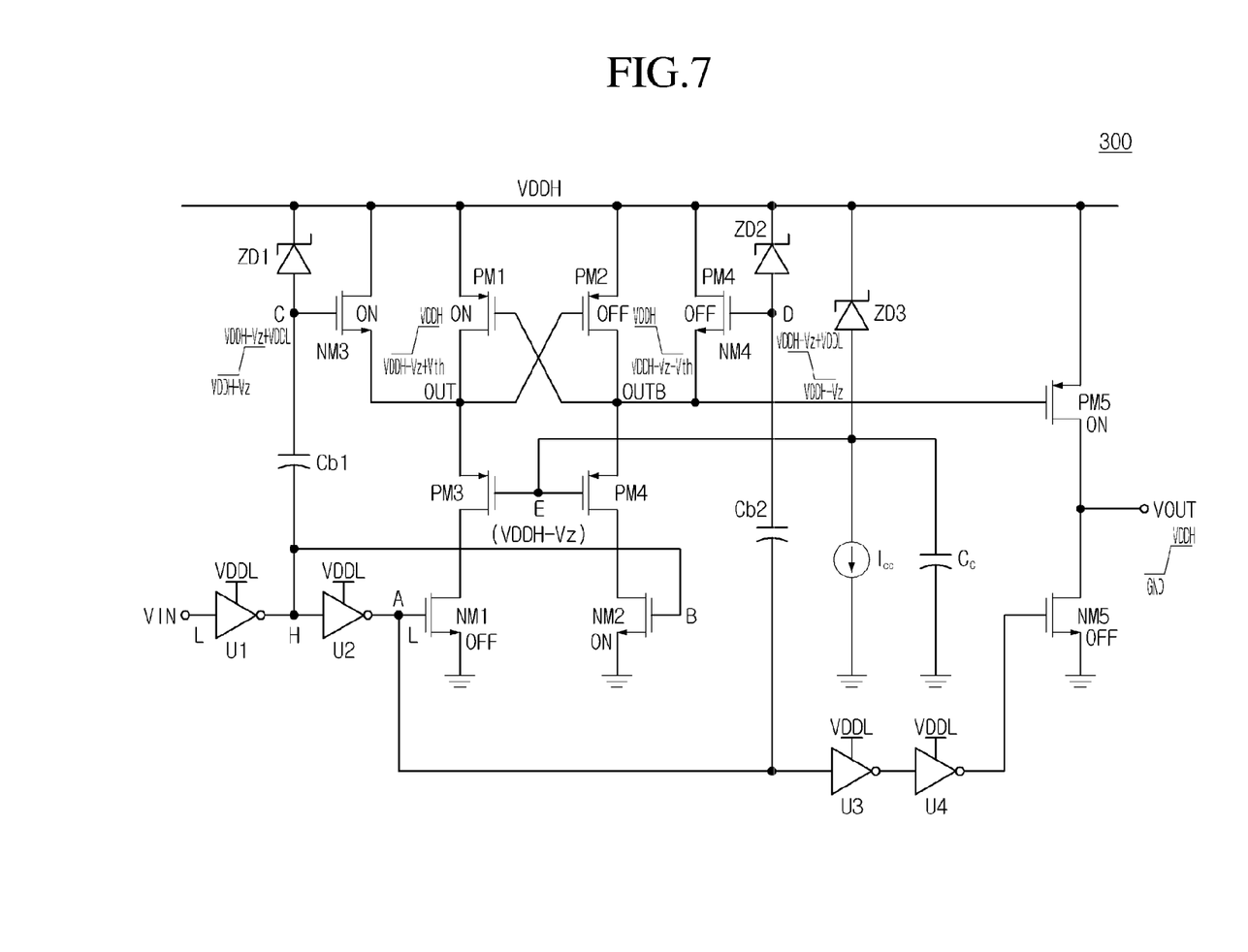
FIG. 7 is a circuit diagram showing the operation of the level shift device of FIG. 5 to receive the input signal having a low level.

FIG. 7 is a circuit diagram showing the operation of the level shift device of FIG. 5 to receive the input signal having a low level of FIG. 5.

If a low-level input signal VIN is input, the second NMOS NM2 provided at the lower portion of the level shift device 300 is turned on, and the first NMOS NM1 is turned off, so that the state of the node OUTB is shifted from a 'High' state to a 'Low' state by the second NMOS NM2. Accordingly, the first PMOS PM1 placed at the upper side of the level shift device 300 is turned on to shift the state of the node OUT from a 'Low' state to a 'High' state, so that the second PMOS PM2 placed at the upper side of the level shift device 300 is turned off. In this case, the voltage at the node D is reduced from the voltage VDD-Vz+VDDL to the voltage VDD-Vz by the second bootstrap capacitor Cb2, the fourth NMOS NM4 of the pull-up time reducing time 32-2 is turned off, and the voltage at the node C is increased from voltage VDD-Vz to voltage VDD-Vz+VDDL by the first bootstrap capacitor Cb1, so that the third NMOS NM3 of the pull-up time reducing unit 32-1 is turned on. Accordingly, the time at which the voltage at the node OUT is charged with VDDH is reduced. In this case, the voltage at the node OUTB is restricted to predetermined voltage VDD-Vz+Vth through the above-described principle, so that the Vgs of the first PMOS PM1 placed at the upper side of the level shift device 300 is maintained to predetermined voltage Vz-Vth. Accordingly, the Vgs breakdown phenomenon of the pull-up PMOS resulting from the increase of the supply voltage VDDH does not occur, and the Zener diode is not used different from the related art, so that the undesirable static current does not occur.

The fifth PMOS PM5 placed at the upper side of the voltage output unit 33 is turned on by the latch-type level shifter unit 30, and the fifth NMOS NM5 placed at the lower side of the voltage output unit 33 is turned off, so that the terminal VOUT outputs the supply voltage VDDH.

Hereinafter, still another embodiment will be described with reference to FIG. 8.

Figure 8:
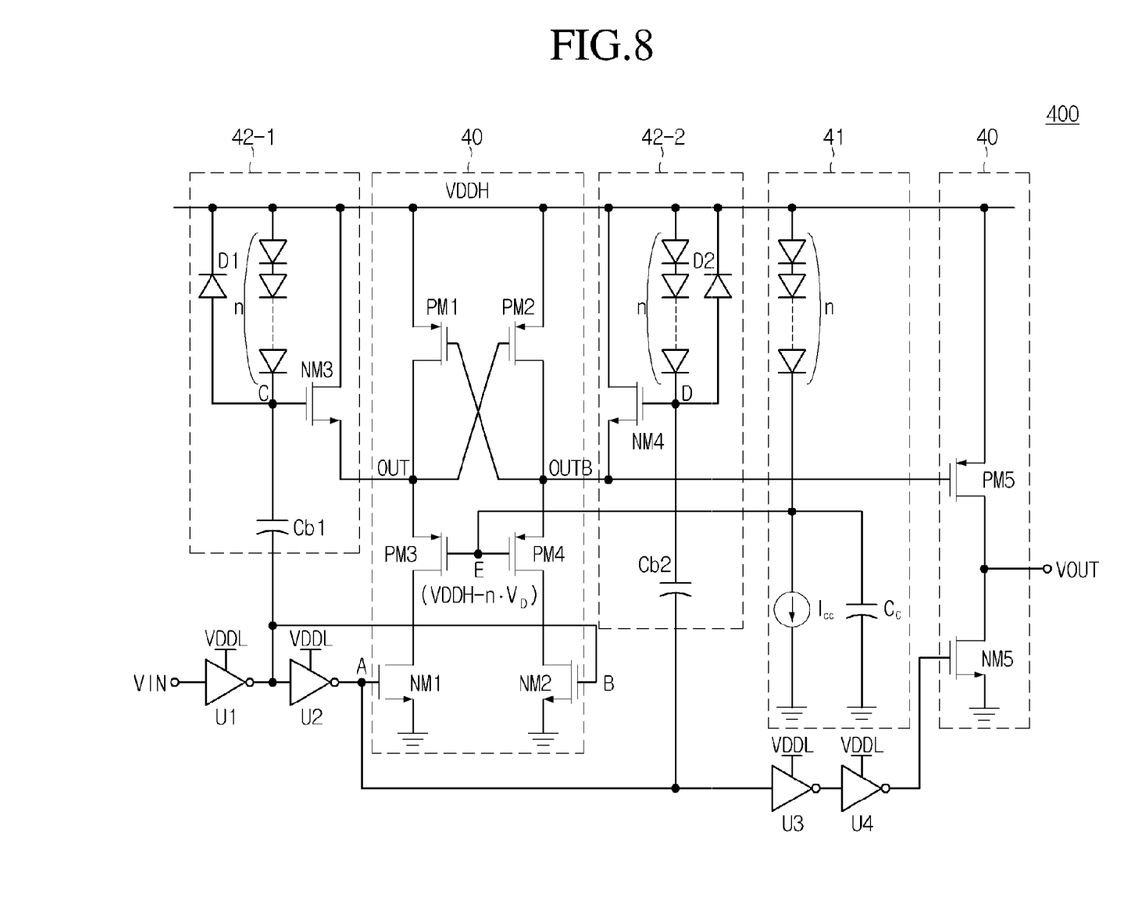
FIG. 8 is a circuit diagram showing a level shift device according to still another embodiment.

FIG. 8 is a circuit diagram showing a level shift device 400 according to still another embodiment.

As shown in FIG. 8, the level shift device 400 according to still another embodiment includes a NOT gate U1, a NOT gate U2, a NOT gate U3, a NOT gate U4, a latch-type level shifter unit 40, a voltage generator 41, a pull-up time reducing unit 42-1, a pull-up time reducing unit 42-2, and a voltage output unit 43.

As shown in FIG. 8, the Zener diode of the voltage generator 31 of FIG. 5 may be substituted with N diodes connected in series. In this case, the voltage at the node E is constantly maintained to the voltage VDDH-n*VD, so that the Vgs of the first and second PMOSs PM1 and PM2 placed at the upper side is maintained to predetermined voltage n*VD-Vth.

As shown in FIG. 8, the Zener diode of the pull-up time reducing units 32-1 and 32-2 of FIG. 5 may be substituted with N diodes connected in series. Anodes of N diodes connected in series receive high-voltage level driving voltage, and cathodes of the N diodes may be connected to a node C.

The number n of diodes of the pull-up time reducing units 42-1 and 42-2 is the same as the number n of diodes of the voltage generator 41. If the number n of diodes of the pull-up time reducing units 42-1 and 42-2 is smaller than or larger than the number n of diodes of the voltage generator 41, the third NMOS NM3 and the fourth NMOS NM4 of the pull-up time reducing units 42-1 and 42-2 may not be normally turned on or turned off. Accordingly, the propagation delay may not be reduced or the static current may be generated.

In order to prevent voltages at the nodes OUT and OUTB from being increased to VDDH+VD or more, the first and second diodes D1 and D2 are inversely arranged in parallel to N diodes.

According to one embodiment, the above method may be realized in the form of process-readable codes in a medium having a program recoded therein. Process-readable media may include a ROM, a RAM, a CD-ROM, a magnetic tape, a floppy disc, and an optical data storage device, and may be implemented in the form of a carrier wave (transmission through the Internet).

The level shift device described above is applied without limitation to the constitution and the method according to the above embodiment. The whole embodiments or parts of the embodiments can be selectively combined so that various variations and modifications are possible.

What is claimed is:

1. A level shift device to convert an input signal having a first voltage level into an output signal having a second voltage level, the level shift device comprising:
   a latch-type level shifter comprising two upper pull-up P channel transistors and two lower P channel transistors to prevent gate-source voltage breakdown of the two upper pull-up P channel transistors, the two upper pull-up P channel transistors and two lower P channel transistors being configured in a latch structure,
   wherein the latch structure is each gate electrode of the two upper pull-up P channel transistor cross-connected to each drain electrode of the two upper pull-up P channel transistor, respectively; and
   a voltage generate unit to generate a predetermined voltage to prevent the gate-source voltage breakdown of the two upper pull-up P channel transistors and provide the predetermined voltage to gate electrodes of the two lower P channel transistors,
   wherein the voltage generate unit comprises:
   a Zener diode having an anode electrode connected to a gate electrode of one of the upper pull-up P channel transistor,
   a current source having a current input terminal connected to the anode electrode of the Zener diode,
   a capacitor having one terminal connected to the anode of the Zener diode and an opposite end connected to a ground,
   wherein the current source is connected to the capacitor in parallel,
   wherein the second voltage level is higher than the first voltage level.

2. The level shift device of claim 1, further comprising a pull-up time reducing unit to reduce a pull-up time of each of the two upper pull-up P channel transistors through a pull-up N channel transistor,
   according to increased gate voltage of the pull-up N channel transistor by a bootstrap capacitor which is connected to a gate electrode of the pull-up N channel transistor.

3. The level shift device of claim 2, further comprising a voltage output unit to buffer a signal of a drain electrode of one of the two upper pull-up P channel transistors and output the output signal.

4. A level shift device to convert an input signal having a first voltage level into an output signal having a second voltage level, the level shift device comprising:

a first P channel transistor;

a second P channel transistor comprising a gate electrode connected to a drain electrode of the first P channel transistor and a drain electrode connected to a gate electrode of the first P channel transistor;

a third P channel transistor comprising a source electrode connected to the drain electrode of the first P channel transistor;

a fourth P channel transistor comprising a source electrode connected to the drain electrode of the second P channel transistor and a gate electrode connected to a gate electrode of the third P channel transistor;

a first Zener diode having an anode electrode connected to the gate electrode of the third P channel transistor;

a current source having a current input terminal connected to the anode electrode of the first Zener diode; and a capacitor having one terminal connected to the anode of the first Zener diode and an opposite end connected to a ground, wherein the current source is connected to the capacitor in parallel, wherein the second voltage level is higher than the first voltage level.

5. The level shift device of claim 4, wherein a first driving voltage having the second voltage level is applied to a source electrode of the first P channel transistor, wherein the first driving voltage is applied to a source electrode of the second P channel transistor, and wherein the first driving voltage is applied to a cathode electrode of the first Zener diode.

6. The level shift device of claim 5, further comprising:

a first N channel transistor comprising a drain electrode connected to a drain electrode of the third P channel transistor, a gate electrode to receive a non-inverted signal of the input signal, and a source electrode connected to the ground; and a second N channel transistor comprising a drain electrode connected to a drain electrode of the fourth P channel transistor, a gate electrode to receive an inverted signal of the input signal, and a source electrode connected to the ground.

7. The level shift device of claim 6, further comprising:

a third N channel transistor comprising a drain electrode to receive the first driving voltage and a source electrode connected to the drain electrode of the first P channel transistor;

a second Zener diode comprising an anode electrode connected to a gate electrode of the third N channel transistor and a cathode electrode to receive the first driving voltage; and a first capacitor comprising one terminal connected to an anode electrode of the second Zener diode and an opposite terminal to receive the inverted signal of the input signal.

8. The level shift device of claim 7, further comprising:

a fourth N channel transistor comprising a drain electrode to receive the first driving voltage and a source electrode connected to a drain electrode of the second P channel transistor;

a third Zener diode comprising an anode electrode connected to a gate electrode of the fourth N channel transistor and a cathode electrode to receive the first driving voltage; and a second capacitor comprising one terminal connected to the anode electrode of the third Zener diode and an opposite terminal to receive the non-inverted signal of the input signal.

9. The level shift device of claim 4, further comprising:

a fifth P channel transistor comprising a source electrode to receive the first driving voltage, a gate electrode connected to the drain electrode of the second P channel transistor, and a drain electrode to output the output signal; and a fifth N channel transistor comprising a drain electrode connected to the drain electrode of the fifth P channel transistor, a gate electrode to receive the non-inverted signal of the input signal, and a source electrode connected to the ground.

10. The level shift device of claim 9, further comprising:

a constant current source comprising a current input terminal connected to an anode electrode of the first Zener diode and a current output terminal connected to the ground; and a third capacitor.

* * * * *